United States Patent [19]
Lin

[11] Patent Number: 5,550,074
[45] Date of Patent: Aug. 27, 1996

[54] PROCESS FOR FABRICATING MOS TRANSISTORS HAVING ANTI-PUNCHTHROUGH IMPLANT REGIONS FORMED BY THE USE OF A PHASE-SHIFT MASK

[75] Inventor: Jengping Lin, Taoyuan Hsien, Taiwan

[73] Assignee: United Microelectronics Corp., Taiwan

[21] Appl. No.: 591,236

[22] Filed: Jan. 19, 1996

[51] Int. Cl.⁶ .............................................. H01L 21/265
[52] U.S. Cl. ..................... 437/44; 437/26; 437/28; 437/29; 437/45; 148/DIG. 137; 148/DIG. 106
[58] Field of Search ........................... 437/26, 28, 29, 437/44, 45; 148/DIG. 23, DIG. 106, DIG. 111, DIG. 137

[56] References Cited

U.S. PATENT DOCUMENTS

| | | | |
|---|---|---|---|
| 5,208,168 | 5/1993 | Parrillo et al. | 437/26 |
| 5,429,956 | 7/1995 | Shell et al. | 437/29 |
| 5,434,093 | 7/1995 | Chau et al. | 437/44 |
| 5,444,008 | 8/1995 | Han et al. | 437/45 |
| 5,489,543 | 2/1996 | Hong | 437/26 |

Primary Examiner—Trung Dang
Attorney, Agent, or Firm—Ladas & Parry

[57] ABSTRACT

Disclosed is a semiconductor fabrication process for fabricating MOS transistors in which ions are implanted only beneath the channel and are not overlapped with the source/drain regions so as to significantly reduce the junction capacitance of the source/drain regions for performance enhancement. The process comprises a first step of preparing a silicon substrate on which a field oxide region is formed to define an active region. In the second step, a phase-shift mask is used to define a substantially rectangular removal portion on a photoresist layer. One side of the rectangular removal portion is substantially aligned with the channel of the MOS transistor to be fabricated and the other three sides are placed within the field oxide region. In the third step, an anti-punchthrough implantation process is performed, in which ions are implanted through the removal portion of the photoresist layer to form an anti-punchthrough implant region beneath the channel of the MOS transistor; and in the final step, a gate region and source/drain regions are formed. The thus formed anti-punchthrough implant region is right beneath the channel of the MOS transistor and does not overlap with the source/drain regions. The packing density and performance of chips containing MOS transistors thus fabricated are high.

6 Claims, 5 Drawing Sheets

PROCESS FOR FABRICATING MOS TRANSISTORS HAVING ANTI-PUNCHTHROUGH IMPLANT REGIONS FORMED BY THE USE OF A PHASE-SHIFT MASK

This application originates from Taiwan patent application No. 84112981 filed Jun. 12, 1995. Said document is incorporated herein by reference.

BACKGROUND OF THE INVENTION

1. Field of the Invention

The present invention relates to semiconductor fabrication processes, and more particularly, to a semiconductor fabrication process for fabricating MOS (metal-oxide semiconductor) transistors having anti-punchthrough implant regions formed by the use of phase-shift masks.

2. Description of Prior Art

The advance in semiconductor fabrication technology allows computers and electronic devices to be made more complex in structure to provide powerful performance. With increased consideration of cost and reliability, the demand for ICs with a high packing density of transistors increases. Allowing high packing density on ICs is not a task easily achievable simply by reducing the feature proportions of the circuit layout size because such a change in the feature proportions of the circuit layout size is restricted by the design rule. Moreover, the change in the size of a semiconductor device could also result in a change in its physical characteristics.

In the case of a MOS transistor, its channel length is limited to a certain level of reduction. If the channel length is shorter than that limit, the undesired results of short channel effect and punchthrough occur. A solution to the short channel effect problem is to apply a lightly doped drain (LDD) structure to the MOS transistor; and a solution to the punchthrough problem is to apply anti-punchthrough implantation to the MOS transistor so as to raise the threshold punchthrough voltage therein.

FIGS. 1A–1D, are schematic sectional diagrams depicting the steps involved in a conventional process for fabricating an N-type MOS transistor. Referring to FIG. 1A, in the first step a p-type substrate 200 is prepared, on which a layer of pad oxide 202 and a layer of silicon nitride 204 are successively formed. Next, a lithographic process is performed, in which a photoresist layer 206 is coated on the active regions of the silicon nitride layer 204 and an active mask is then used for etching the exposed silicon nitride. The remaining silicon nitride is then used as a mask for channel stop implant using high-concentration p-type ions.

Referring next to FIG. 1B, in the subsequent step the photoresist layer 206 is removed and the remaining silicon nitride acts as an anti-oxidation mask. The wafer is then subject to heat oxidation treatment to form field oxide regions 212. The silicon nitride layer 204 and the pad oxide layer 202 are then removed. The result is a LOCOS layer.

Referring further to FIG. 1C, after the silicon nitride layer 204 and the pad oxide layer 202 are removed, a thin protective oxidation layer 222 is formed. Next, a threshold adjustment implant region 232 and an anti-punchthrough implant region 234 are formed by using p-type ions such as boron ions. The provision of these two regions 232, 234 allows increase in the concentration of impurities within and below the channel so as to raise the critical voltage and punchthrough voltage in the MOS transistor to desired levels.

Referring finally to FIG. 1D, a gate layer (the anti-punchthrough implant region) 235 and source/drain regions 236 are formed. The gate layer 235 can be polycrystalline silicon or polycide; and the source/drain regions 236 are made in such a way so as to prevent the short channel effect. The involved processes are conventional techniques well known to those skilled in the art of semiconductor fabrication, so the details thereof will not be described herein.

In response to growing demand for higher packing density, it is necessary to shorten the length of the channel in the MOS transistor to less than 0.5 µm. This level of reduction causes the foregoing conventional anti-punchthrough implantation process not to meet current requirements. As shown in FIG. 1D, if the channel length is shorten to less than 0.5 µm, the anti-punchthrough implant region 234 comes in very close proximity to the source/drain regions 236. This causes the source/drain regions 236 to have high junction capacitance, which delays any electrical signal passing therethrough and thus the performance of the MOS transistor is considerably affected.

Accordingly, there exists a need for a MOS transistor fabrication process by which the anti-punchthrough implant region is formed only beneath the channel having a length of less than 0.5 µm and does not overlap with the source/drain regions, so as to significantly reduce the junction capacitance of the source/drain regions for performance enhancement. However, the restrictions of current design rules make such a goal is still difficult to achieve.

SUMMARY OF THE INVENTION

It is therefore a primary objective of the present invention to provide a semiconductor fabrication process for fabricating MOS transistors in which ions are implanted only beneath the channel and do not overlap with the source/drain regions so as to significantly reduce the junction capacitance of the source/drain regions for performance enhancement.

In accordance with the foregoing and other objectives of the present invention, there is provided with a new and improved semiconductor fabrication process for fabricating MOS transistors. The process comprises the following steps of: (1) preparing a silicon substrate on which a field oxide region is formed to define an active region; (2) using a phase-shift mask to define a substantially rectangular removal portion on a photoresist layer, one side of the rectangular removal portion being aligned with the channel of the MOS transistor to be fabricated and the other three sides being placed within the field oxide region; (3) performing an anti-punchthrough implantation process in which ions are implanted through the removal portion of the photoresist layer to form an anti-punchthrough implant region beneath the channel of the MOS transistor; and (4) forming gate region and source/drain regions for the MOS transistor.

BRIEF DESCRIPTION OF DRAWINGS

The present invention can be more fully understood by reading the subsequent detailed description of the preferred embodiments thereof with references made to the accompanying drawings, wherein.

DETAILED DESCRIPTION OF PREFERRED EMBODIMENT

Figure 1A:
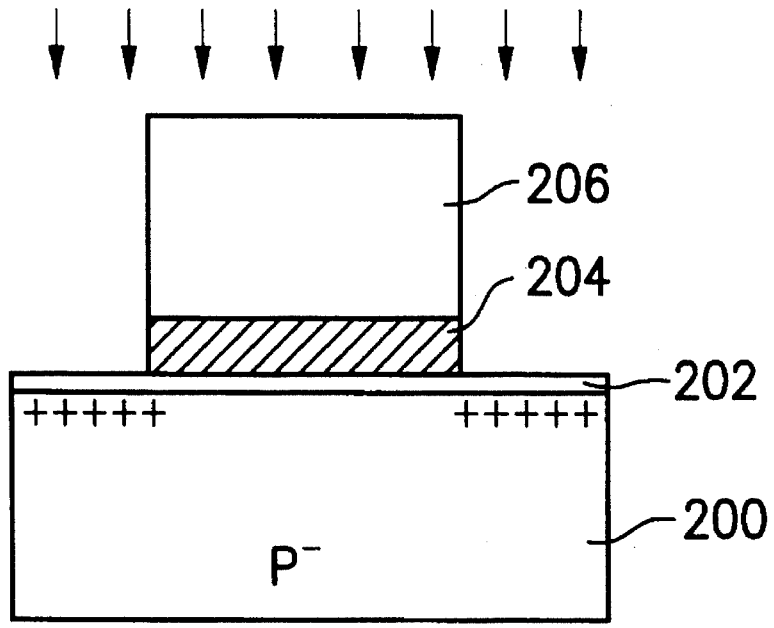
FIGS. 1A–1D are schematic sectional diagrams used to depict the steps involved in a conventional process for fabricating an N-type MOS transistor.
Figure 1B:
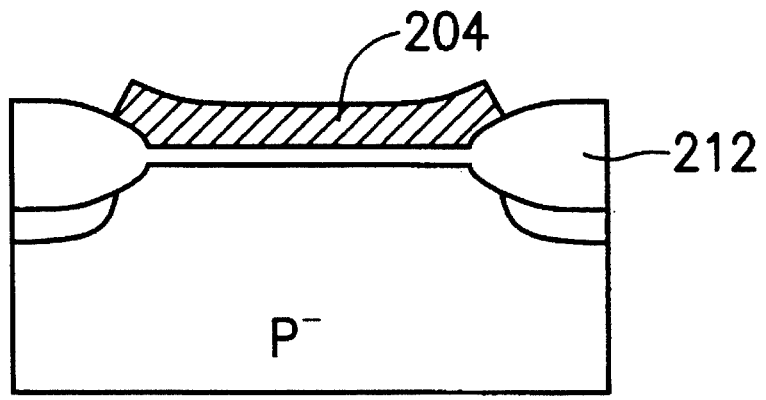
Figure 1C:
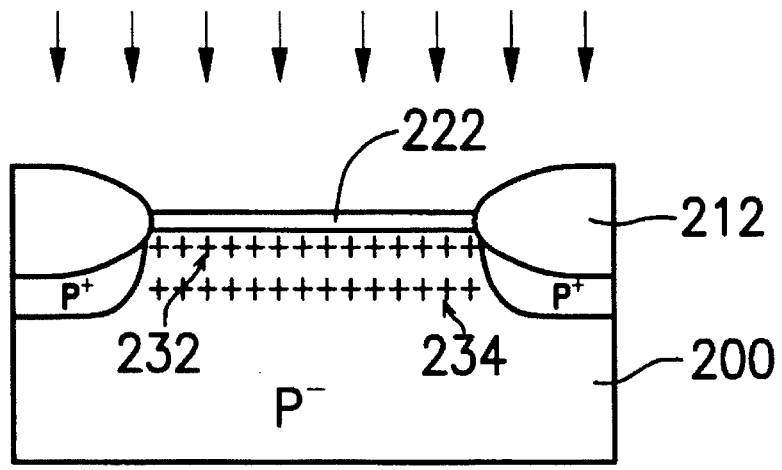
Figure 1D:
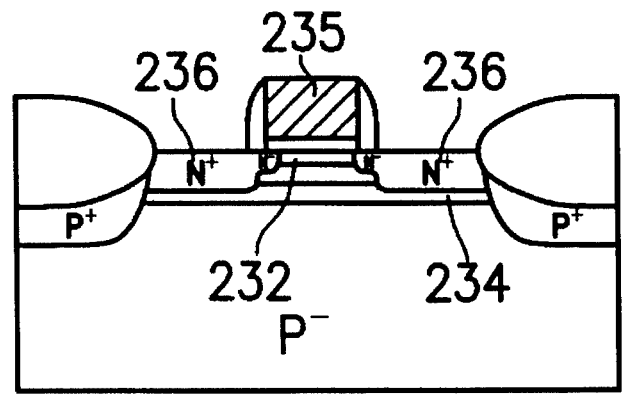
Figure 2A:
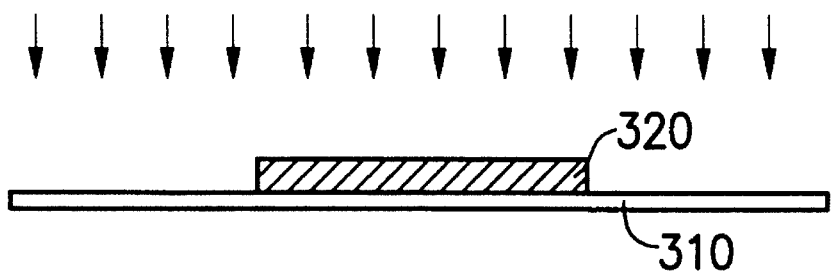
FIGS. 2A–2D are schematic diagrams used to depict the principle of a phase-shift mask employed in the semiconductor fabrication process according to the present invention.
Figure 2B:
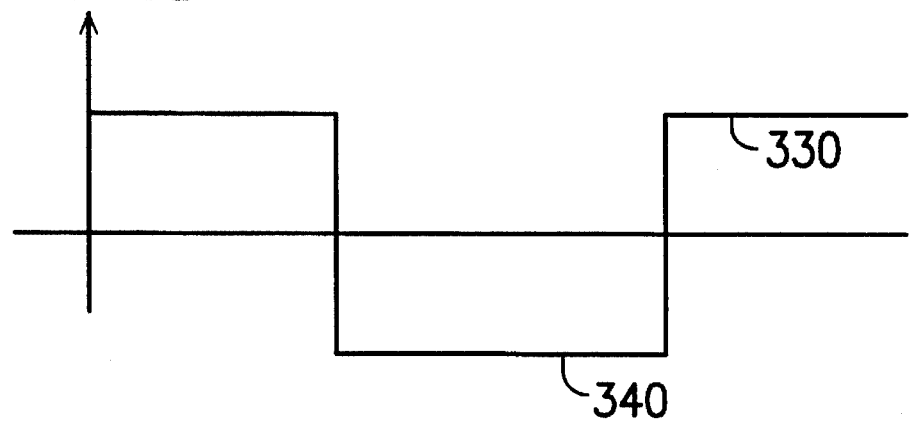
Figure 2C:
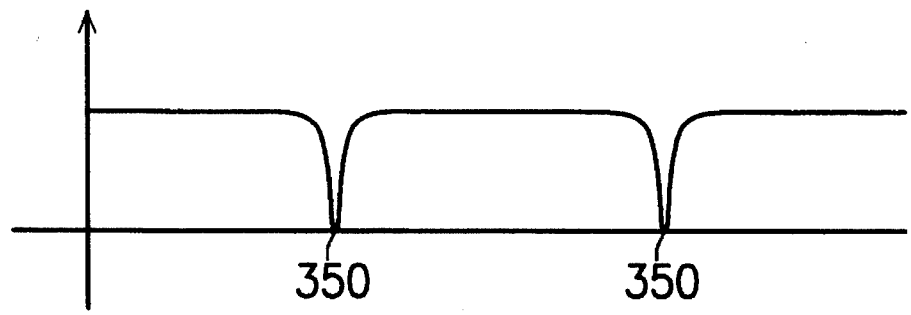
Figure 2D:
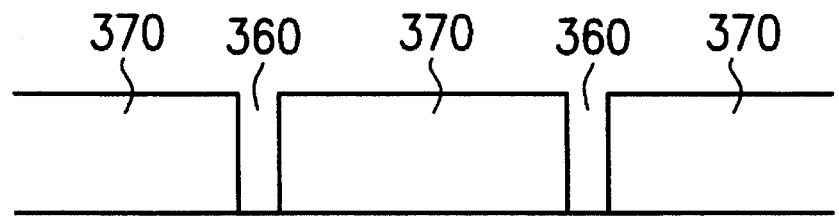

Referring to FIGS. 2A–2D, there are shown schematic diagrams used to depict the principle of a phase-shift mask employed in the semiconductor fabrication process according to the present invention. Referring to FIG. 2A, the phase-shift mask consists of a transparent substrate 310 and a transparent thin film 320 overlaying on the transparent substrate 310. The transparent thin film 320 has a thickness that allows the light passing therethrough to be phase shifted by exactly 180°. When the phase-shift mask is placed on a stepper, the light from the stepper will pass through the phase-shift mask onto a photoresist layer 370. As depicted in FIG. 2B, the amplitude 340 of the light passing through both the transparent substrate 310 and the transparent thin film 320 and the amplitude 330 of the light passing through the transparent substrate 310 will have a phase difference of 180°. The intensity, which is the square of the amplitude, has a distribution as shown in FIG. 2C. It can be seen from FIG. 2C that at the edge of the transparent thin film 320 the intensity is sharply reduced to zero, as indicated by the numeral 350. As a result of this, those portions of the photoresist layer 370 that are aligned with the edge of the transparent thin film 320 can be etched into narrow removal portions 360 having a width of less than 0.2 μm, as shown in FIG. 2D.

Figure 3A:
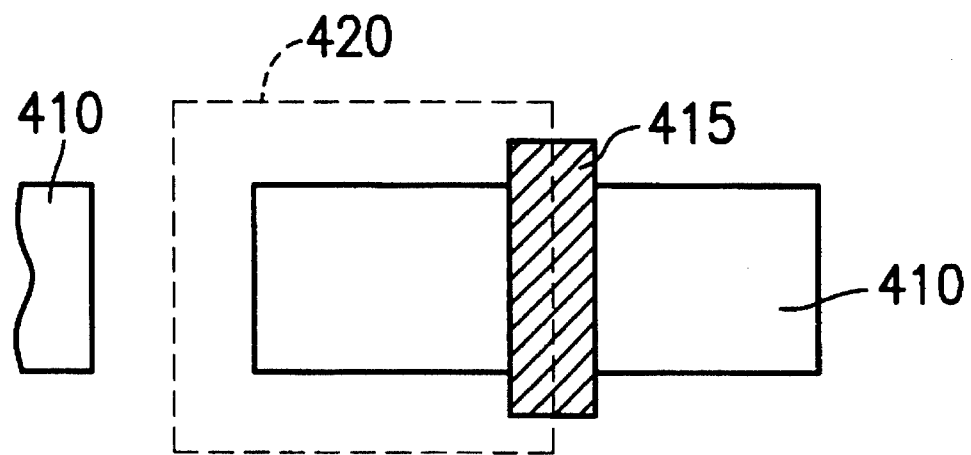
FIG. 3A is a top view showing particularly the position of the phase-shift mask employed in the semiconductor fabrication process according to the present invention.

Referring to FIG. 3A, there is shown the utilization of the phase-shift mask (designed by the numeral 420 here) in the semiconductor fabrication process according to the present invention to form anti-punchthrough implant regions in a MOS transistor. The active region 410 is an activity region for the carriers in the MOS transistor. The areas outside the active region 410 is insulated by a LOCOS region. The gate region 415 overlays the active region 410. The overlapping region of the active region 410 and the gate region 415 defines the channel. In preferred embodiment, the phase-shift mask 420 has one side aligned to the top of the gate region 415, preferably aligned exactly to the center line of the gate region 415 as illustrated in FIG. 3A. The other three sides of the phase-shift mask 420 are placed beyond the active region 410 but within the LOCOS region. The purpose of such an arrangement is to allow the beam of ions used in the implantation to aim precisely at the underneath portion of the channel, which will be described in detail later.

Figure 3B:
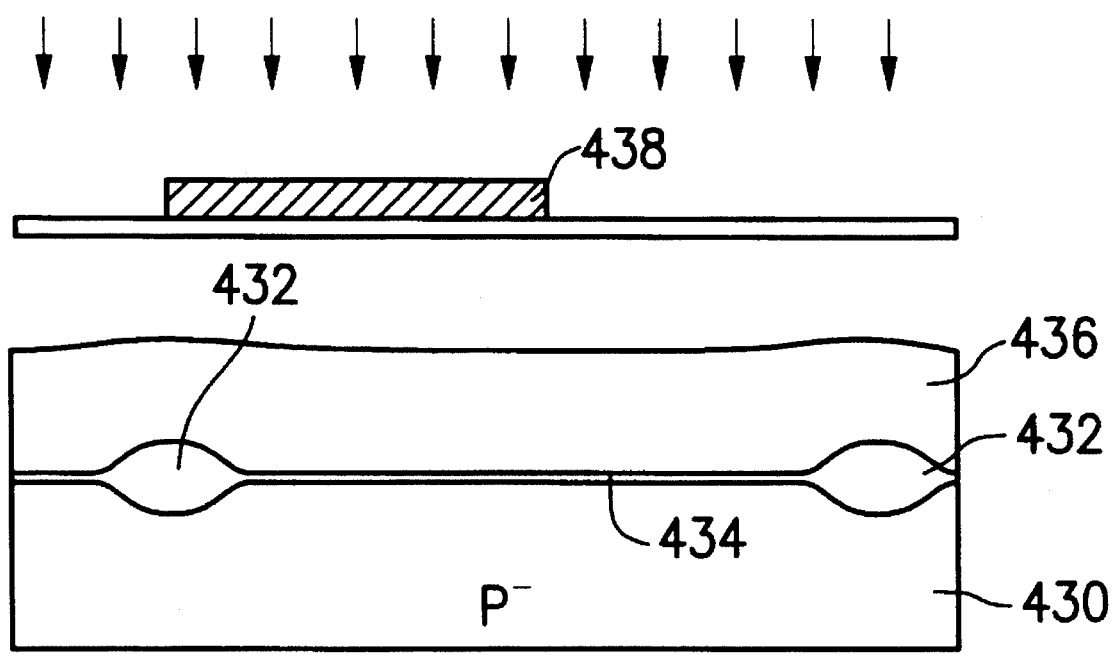
FIGS. 3B–3D are sectional diagrams used to depict the steps involved in the process for fabricating a MOS transistor according to the present invention with the phase-shift mask positioned as shown in FIG. 3A.
Figure 3C:
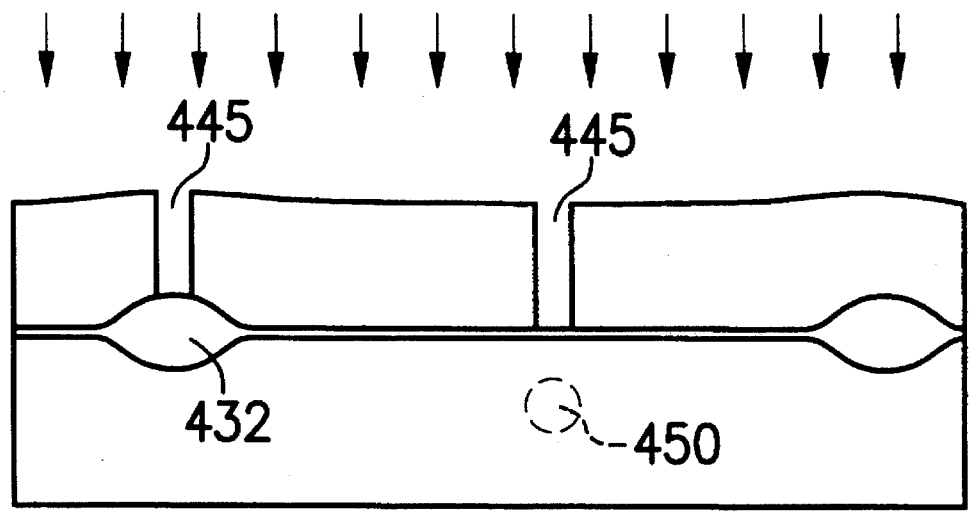
Figure 3D:
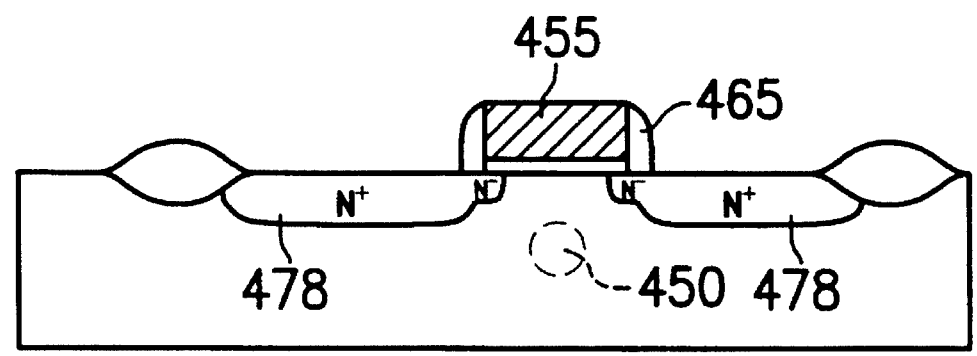

Referring further to FIGS. 3B–3D, there are shown sectional diagrams used to depict the steps involved in the process for fabricating a MOS transistor according to the present invention with the phase-shift mask 420 positioned as shown in FIG. 3A. Referring to FIG. 3B, on a substrate 430 is there formed with an oxidation layer 432 by, for example, the LOCOS fabrication process, so as to define the active region. In preferred embodiment, the oxidation layer 432 is formed with a thickness of about 4000 Å. Next, a protective oxidation layer 434 is formed. In preferred embodiment, the protective oxidation layer 434 is formed with a thickness of about 300 Å and oxidized under a temperature of about 900° C. Subsequently, a photoresist layer 436 is deposited upon the entire surface of the wafer. The phase-shift mask 420 shown in FIG. 3A is then used for pattern definition on the photoresist layer 436.

Referring next to FIG. 3C, after development, a rectangular removal portion 445 having a width of less than about 0.2 μm is formed through the photoresist layer. One side of the rectangular removal portion 445 is formed at a position atop the gate region which is to be formed later and the other three sides are formed outside the active region 410 but within the LOCOS region 432. The developed photoresist layer is then used as a mask in the anti-punchthrough implantation process. In the preferred embodiment, a source of boron ions having a concentration of about $3\times10^{12}$ atoms/cm$^2$ and an energy of about 70 KeV is used for the implantation. Passing through the rectangular removal portion 445, the ions bombarded upon the active region form an anti-punchthrough implant region 450 right beneath the channel of the MOS transistor, while the ions bombarded upon the LOCOS region 432 will not punch therethrough.

Referring to FIG. 3D, in the subsequent step, a conventional process is used to form the gate region 455. The sidewall of the gate region 455 is formed with insulation 465 that facilitates the making of a lightly doped N$^+$-type source/drain region 478. All the subsequent steps involved in finishing the fabrication of the MOS transistor are conventional techniques, so that description thereof will not be given herein.

As shown in FIG. 3C and FIG. 3D, in accordance with the semiconductor fabrication process of the present invention, the anti-punchthrough implantation can be performed locally beneath the channel of the MOS transistor to form the anti-punchthrough implant region 450 which is not overlapped with the source/drain region 478 as required. In accordance with the semiconductor fabrication process of the present invention, the conventionally used i line having a wavelength of 365 nm can be used in the lithographic process to form the removal portion 445 having a width less than 0.2 μm. This allows the fabrication of MOS transistors with a channel length less than 0.5 μm to have the anti-punchthrough implant formed precisely beneath the channel without overlapping with the source/drain region 478.

The present invention has been described hitherto with exemplary preferred embodiments. However, it is to be understood that the scope of the present invention need not be limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A process for fabricating a MOS transistor having a channel, comprising the following steps of:

(1) preparing a silicon substrate on which a field oxide region is formed to define an active region;

(2) using a phase-shift mask to define a substantially rectangular removal portion on a photoresist layer, one side of the rectangular removal portion being aligned with the channel of the MOS transistor to be fabricated and the other three sides being placed within the field oxide region;

(3) performing an anti-punchthrough implantation process in which ions are implanted through the removal portion of the photoresist layer to form an anti-punchthrough implant region beneath the channel of the MOS transistor; and (4) forming gate region and source/drain regions for the MOS transistor.

2. A process as set forth in claim 1, wherein the source/drain regions are lightly doped drain structures.

3. A process as set forth in claim 1, further comprising before said Step (2) a step of forming a protective oxidation layer on the silicon substrate.

4. A process as set forth in claim 3, wherein the protective oxidation layer has a thickness of about 300 Å.

5. A process as set forth in claim 1, wherein the field oxide layer has a thickness of about 4000 Å.

6. A process as set forth in claim 1, wherein in said Step (3) a source of boron ions having a concentration of about $3 \times 10^{12}$ atoms/cm$^2$ and an energy of about 70 KeV is used for the anti-punchthrough implantation process.

* * * * *